United States Patent [19]

Hawkswell

[11] Patent Number: 4,917,568
[45] Date of Patent: Apr. 17, 1990

[54] SUCTION PICK-UP APPARATUS FOR ELECTRICAL OR ELECTRONIC COMPONENTS

[75] Inventor: Victor T. Hawkswell, Witham, England

[73] Assignee: Emhart Industries, Inc., Hartford, Conn.

[21] Appl. No.: 150,128

[22] Filed: Jan. 29, 1988

[30] Foreign Application Priority Data

Feb. 5, 1987 [GB] United Kingdom ............... 8702618

[51] Int. Cl.⁴ ............................................. B25J 15/06
[52] U.S. Cl. .................................. 414/737; 198/346.2; 294/64.1; 414/225; 901/40
[58] Field of Search ............... 414/736, 737, 744, 752, 414/225, 744.2, 744.3, 744.8; 901/21, 40; 294/64.1; 198/346.2

[56] References Cited

U.S. PATENT DOCUMENTS

| | | | |
|---|---|---|---|
| 3,881,607 | 5/1975 | Lewis | 414/744 A X |
| 4,015,721 | 4/1977 | Scheler | 414/744 A |
| 4,507,044 | 3/1985 | Hutchins et al. | 901/21 X |
| 4,556,362 | 12/1985 | Bahnck et al. | 414/744 B |
| 4,657,470 | 4/1987 | Clarke et al. | 901/40 X |
| 4,675,993 | 6/1987 | Harada | 901/46 |
| 4,676,710 | 6/1987 | Shiraishi | 414/225 |
| 4,695,215 | 9/1987 | Jacoby et al. | 414/225 |
| 4,703,965 | 11/1987 | Lee et al. | 294/64.1 |

Primary Examiner—Robert J. Spar
Assistant Examiner—Donald W. Underwood
Attorney, Agent, or Firm—Spencer T. Smith

[57] ABSTRACT

This invention relates to suction pick-up apparatus of an electrical or electronic component placement machine. A pick-up head 16 has a body 82 with a pick-up surface 84 and a piston 94 with a smaller pick-up surface 98 slidable in the body 82. The piston 94 is movable between an operative position projecting beyond the surface 84 and an inoperative position retracted into the body 82 by air under pressure directed to move the piston 94. The head 16 is constructed so that suction can be applied to an appropriate one of the surfaces 84, 98 to retain a component engaged by that surface on the surface. The apparatus may have several pick-up heads 16 mounted at equal intervals about the axis of a carousel 14 for stepwise movement through a plurality of stations 26, 42–58 where various operations are carried out. Where the apparatus comprises a plurality of heads 16 mounted on a carrier 34 an appropriate head may be selected by a bowden cable mechanism 68.

2 Claims, 4 Drawing Sheets

Fig_1

Fig_2

Fig_3

Fig. 4

SUCTION PICK-UP APPARATUS FOR ELECTRICAL OR ELECTRONIC COMPONENTS

BACKGROUND OF THE INVENTION

This invention is concerned with suction pick-up apparatus for handling electrical or electronic components, for example in a component placement machine. The components may be of a variety of shapes and sizes, for example so-called flat packs, S.O. style transistors, leadless chip carriers, dual in line packages, self-type components and the like, as well as so-called "chips".

In the manufacture of electrical or electronic apparatus it is necessary to assemble a plurality of components on a suitable substrate, for example a printed circuit board. A number of systems have been proposed for handling the components to be placed on a substrate and many of these have proposed the use of pick-up heads preferably using suction to retain a component on a tool of the pick-up head when the component is removed from a suitable component supply means, for delivery to a suitable placement position: see for example our PCT Patent Application Publication No. WO 85/03404. As discussed in this PCT patent application, in order to achieve high productivity it is necessary to handle a variety of sizes and shapes of component in a single machine. As well as handling a wide range of component sizes, apparatus for picking up the components and placing them on substrates must also place them accurately in position on the appropriate substrates at high speed, the components being, in most cases, positioned close to one another on the substrate and the tool should be capable of placing components on a substrate without fouling adjacent components. The machine described by way of example in our aforementioned PCT patent application has proved accurate and efficient in placing components on substrates in accurate locations and in restricted areas. However, in order to accurately position components relative to a pick-up head of this previously known machine so that their position is known for placement, the components are located by means of jaws mounted on the pick-up head to engage the components and move them into a correct orientation, the components being retained on the pick-up head by suction applied through a suitable tool; in order to handle a full range of component sizes, means is provided for exchanging the tools carried by the pick-up head so that the pick-up head presents a tool of a size appropriate to the component to be picked up. Although the machine described by way of example in our aforementioned PCT patent application performed satisfactorily, a restriction is placed on its productivity both by the orienting system which relies on the mechanical jaws (as well as the bulk of the jaws which places a restriction on compactness of the pick-up head: the inertia of the pick-up head mounting the jaws and the necessary operating mechanisms is considerable and therefore restricts the operating speed of the head) and the need to change tools which must be exchanged at a tool holder during the machine cycle and also places a speed restriction on the operation of the machine. Furthermore, although the placement accuracy is high, the use of a purely mechanical orienting system places a restriction on the degree of placement accuracy which can be achieved without resorting to engineering of such a high precision that it becomes prohibitively expensive.

One of the objects of the present invention is to provide an improved suction pick-up apparatus for electrical or electronic components having improved means for providing a number of different pick-up tools.

BRIEF SUMMARY OF THE INVENTION

The invention provides in one aspect suction pick-up apparatus for electrical or electronic components the apparatus comprising a pick-up head having a tool including a body having a first pick-up surface at one end portion thereof, a cylinder within the body and a piston member mounted for sliding movement in the cylinder and having a pick-up end portion terminating with a tip having a second pick-up surface of smaller area than the first pick-up surface, the piston member being slidable between an operative position in which its tip projects through an opening in the first pick-up surface beyond the first pick-up surface and an inoperative position in which the tip is retracted inwardly of the first pick-up surface, the body having a first port through which air can be admitted to the cylinder to drive the piston member to its operative position and which can be connected to vacuum to retract the piston member to its inoperative position, the apparatus further comprising means by which, when the piston member is in its inoperative position, suction may be applied to the first pick-up surface whereby a component engaged by the first pick-up surface is retained in contact with the surface when suction is applied and by which, when the piston member is in its operative position, suction may be applied through an opening in the piston member to the second pick-up surface whereby a component engaged by the second pick-up surface is retained in contact with the second pick-up surface when suction is applied through the opening in the piston member.

The invention also provides, in another aspect suction pick-up apparatus for electrical or electronic components, the apparatus comprising a support, a carrier, a plurality of pick-up heads mounted on the carrier, the carrier being mounted on the support for movement whereby to move the heads relative to the support into and out of an operative position, and operating means mounted on the support for moving the carrier to move the heads into and out of the operative position, the operating means comprising a flexible linkage.

The invention further provides in another aspect suction pick-up apparatus for components comprising a carousel mounted for stepwise movement round an axis, carriers mounted on the carousel at equally spaced intervals around the axis, a plurality of pick-up heads mounted on each carrier, each carrier being mounted for movement relative to the carousel whereby the heads mounted on that carrier may be moved into and out of an operative position associated with that carrier, the operative positions of the carriers being equally spaced around the axis of the carousel, and operating means mounted on the carousel for moving the carriers whereby to move an appropriate one of its pick-up heads to the associated operative position.

Although, in apparatus as set out in either of the last two preceding paragraphs, it is preferred to use a pick-up head as set out in the last preceding paragraph but two, other suction pick-up heads of known construction may, if desired be used in apparatus as set out in either of the last two preceding paragraphs.

There now follows a detailed description, to be read with reference to the accompanying drawings, of a component placement machine for picking-up electrical or electronic components and placing them on a substrate comprising suction pick-up apparatus embodying the invention. It will be realised that this machine has been selected for description to illustrate the invention by way of example.

DETAILED DESCRIPTION OF PREFERRED EMBODIMENT OF THE INVENTION

Figure 1:
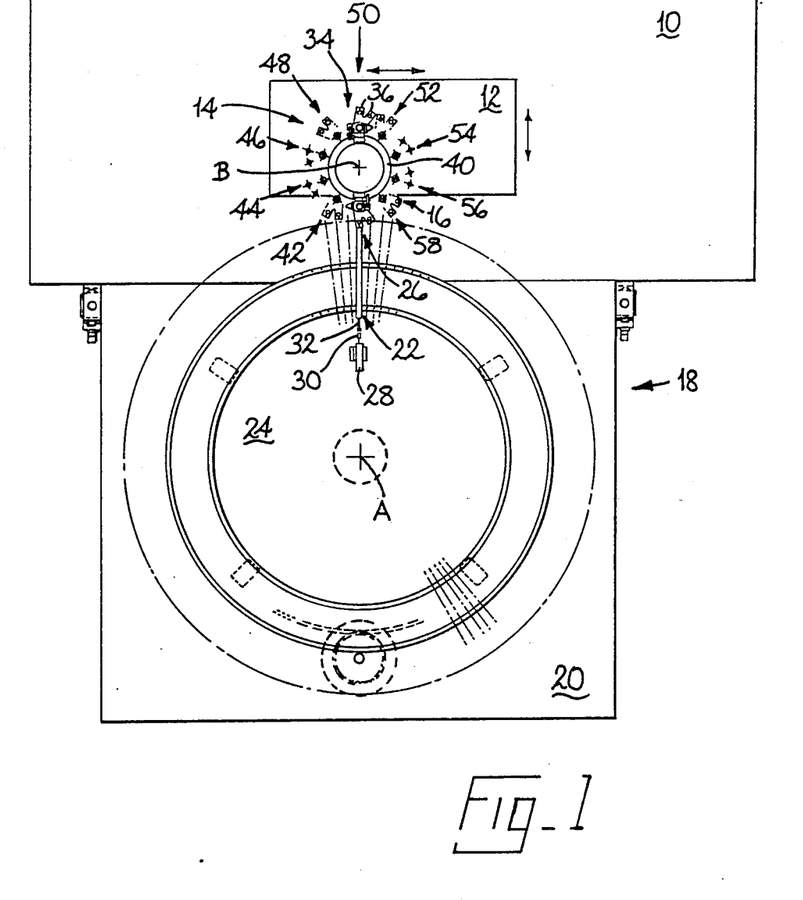
FIG. 1 is a plan view of a component placement machine embodying the invention.

A component placement machine embodying the invention is shown in FIG. 1. The machine comprises a frame 10 on which is mounted an X-Y table 12 and apparatus for handling electrical components comprising a plurality of pick-up heads 16 and a support comprising a carousel 14 on which the pick-up heads 16 are mounted. Substrates (not shown) on which components are to be placed may be mounted in known manner in accurately known positions on the X-Y table; means (not shown) may be provided for feeding substrates to and from the X-Y table 12 for example as described in United Kingdom Patent No. 2150098. The X-Y table may be mounted and driven by any suitable means, a number of which are known: preferably the X-Y table 12 is mounted and driven by means substantially similar to those described in PCT patent application No. WO 85/03404.

The component placement machine further comprises component supply means 18 comprising a sub frame 20, secured in known location to the main frame 10, on which are mounted a plurality of component supply magazines 22. The component supply means 18 comprises a turntable 24 mounted for rotation about a vertical axis A on the sub frame 20, the component supply magazines 22 being mounted radially (about the axis A) on the turntable. In the operation of the illustrative component placement machine, the turntable is rotated about the axis A by drive means to move an appropriate one of the component supply magazines 22 to a transfer station of the supply means 18, viz. a pick-up station 26. The component supply magazines 22 shown in FIG. 1 are so-called tape feeders but other forms of magazine may be used if desired, for example so-called "stick" feeders, vibratory feeders, or stack feeders of the type described in detail in our United Kingdom Patent No. 2147888. As is well known, the components in a tape feeder are packaged in pockets disposed at equally spaced intervals along a flexible tape which is wound about a suitably dimensioned reel; the components are preferably positioned in the pockets of the tape in an orientation which is known—however, neither the positioning nor the orientation of the components in the pockets needs to be particularly precise. In order to deliver a component using a tape feeder to a pick-up position, the tape is indexed to move the tape through a feed step identical with the spacing between the centre of one pocket and the centre of the next adjacent pocket. The component supply means 18 of the illustrative component placement machine comprises a cylinder 28 mounted on the sub-frame 20 in register with a component supply magazine 22 at the pick-up station 26. The cylinder 28 is so positioned that, on admission of fluid under pressure to the cylinder 28 behind a piston slidable in the cylinder, in the operation of the machine, a piston rod 30 is extended from the cylinder into engagement with an indexing plunger 32 of the magazine, whereby to index the tape, carrying components, through a feed step to present a component at the pick-up position of the pick-up station 26.

As mentioned above, the carousel 14 carries a plurality of pick-up heads 16. The pick-up heads 16 are mounted on carriers 34, each carrier 34 comprising a bifurcated member 35 having two arms 36, at an outer end portion of each of which a pick-up head is clamped. Each carrier 34 is mounted on a vertical rod 38 for sliding movement lengthwise of the rod; the bifurcated member 35 is also mounted for rotary movement about a vertical axis C of the rod 38. Each rod 38 is secured to a spider member 40 of the carousel 14 at an end portion of one of ten arms of the spider member 40. Thus the carousel 14 of the illustrative machine comprises ten carriers 34 and twenty pick-up heads 16.

Each carrier 34 also comprises a bracket 60 on which is mounted a slideway 62 having opposite outer edge surfaces parallel to one another and extending generally vertically parallel to the axis C of the associated rod 38. Guide rollers 64 are arranged to run on the opposed parallel guide surfaces of the slideway 62, the guide rollers 64 being rotatably mounted on clamp means 66 secured to the spider member 40. The clamp means 66 also clamps the rod 38 to the spider member 40. By appropriate adjustment of the various parts of the clamp means 66 the position of each carrier 34 relative to adjacent carriers 34 can be adjusted during the initial setting up of the illustrative machine to accurately locate operative positions of the carriers 34 as discussed below.

As hereinbefore mentioned each carrier 34 comprises a bifurcated member 35 comprising two arms 36. Each of the bifurcated members 35 is carried for vertical movement along the rod 38 by its associated bracket 60 and is mounted for pivotal movement about the axis C of the associated one of the rods 38 to move the pick-up heads 16 at the ends of the arms 36 between an operative position and inoperative positions. A pneumatically operated piston and cylinder arrangement (not shown) is mounted on each of the brackets 60 with the cylinder axis extending generally vertically, to operate a flexible linkage, viz. a bowden cable mechanism 68 to pivot the bifurcated member 35 about the axis C and move one or other of the two pick-up heads 16 associated with that particular carrier 34 into the operative position associated with that carrier, the other of the pick-up heads, of course, being simultaneously moved to its inoperative position. Whereas the preferred flexible linkage is a bowden cable mechanism other types of flexible linkage may be used if appropriate e.g. suitable chain or belt linkages. However the bowden cable mechanism is preferred because of its simplicity, compactness and ability to be readily flexed to a suitable position. The operative positions associated with each of the carriers 34 are equiangularly spaced about a vertical axis B about which the carousel 14 is rotatable, the operative positions of the pick-up heads 16 being determined by the position of pick-up surfaces of the heads when placing a component on a substrate at a placement station 50 which should each occupy precisely the same location.

The carousel 14 is mounted for rotation on a column (not shown) fixed to the main frame 10. An appropriately configured cam track is formed around the column. A cam provided by a cam roller (not shown) is mounted on the bracket 60 of each of the carriers 34, the cam rollers being received in the cam track of the column. The cam rollers are urged against a lowermost surface of the cam track and are adjusted so that horizontal datum surfaces of each carrier 34 lie in the same horizontal place when that carrier is at the placement station 50. Thus, as the carousel 14 rotates about its axis B on the column the cam rollers slide in the cam track and cause movement of the brackets 60 (and thump the heads 16 mounted on those brackets 60) in a direction parallel with the axis B during part, at least, of a complete revolution of the carousel 14.

Means (not shown) comprising motor means and a computer control system of the illustrative machine are provided for intermittently rotating the spider member 40 about the vertical axis B of the carousel 14 upon a signal from the computer control system. Preferably the motor means comprises a servo motor and rotary encoder controlled by the control system to rotate the spider member 40 through a suitable gear system (not shown). Each intermittent rotary motion of the spider member 40 advances an arm of the spider member through an angle of 36°. Thus the carousel 14 is mounted for indexing movement around the axis B to index the pick-up heads 16 at operative positions disposed at equally spaced intervals about the axis of rotation B of the carousel 14 in a stepwise movement through a plurality of stations of the illustrative machine. The stations comprise the pick-up station 26, a coarse orientation station 42, a mechanical orientation station 44, an inspection station 46, a fine orientation station 48, the placement station 50, a spare station 52, a dump station 54, a head select station 56 and a pre-orientation station 58; further details of the various stations will be given in the following description.

Each of the pick-up heads 16 is substantially identical in construction and operation, the only significant difference being the dimensions and configuration of pick-up surfaces of tools of each pick-up head 16. For convenience, therefore, only one pick-up head 16 will be described in detail hereinafter: this pick-up head is shown in detail in FIG. 2 of the accompanying drawings.

Figure 2:
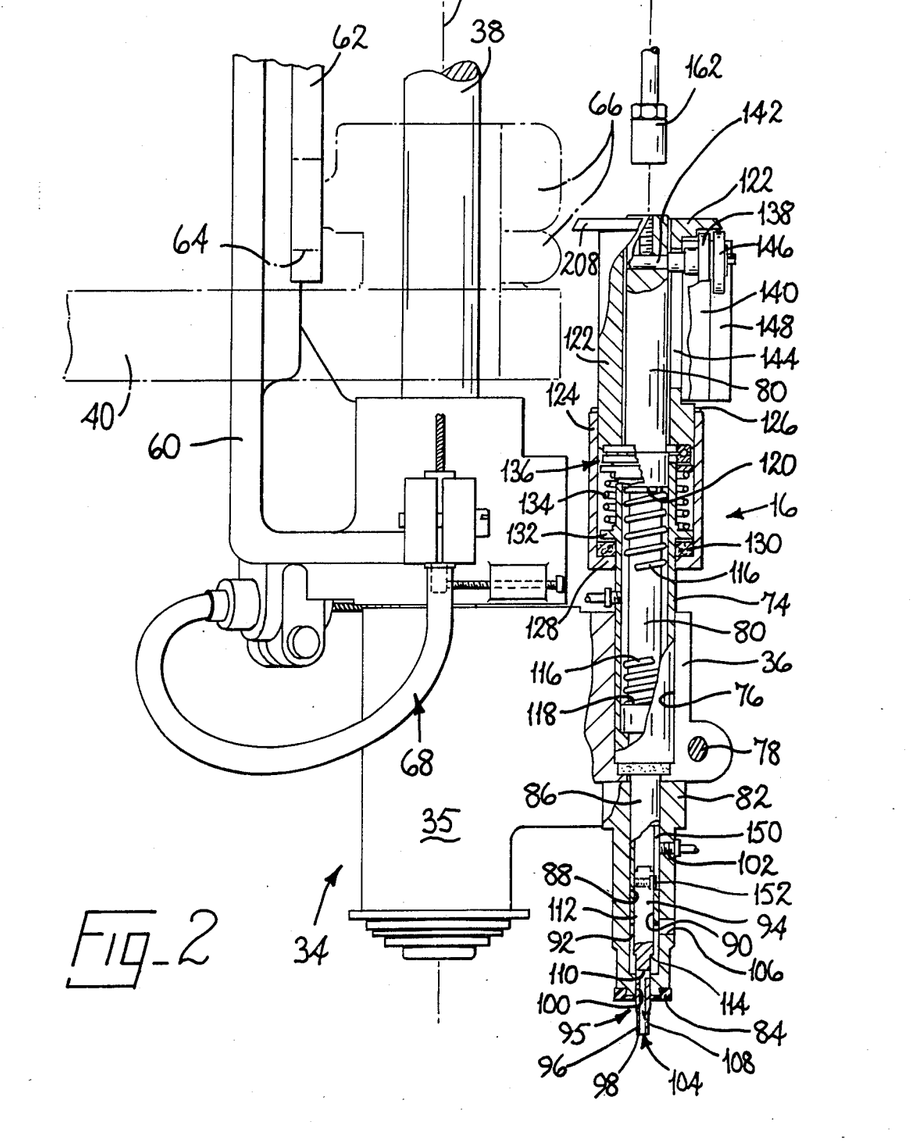
FIG. 2 is a side view, partly in section and with parts broken away showing suction pick-up apparatus of the machine.

As hereinbefore mentioned each pick-up head 16 is mounted at an end portion of one of the arms 36. A tubular support housing 74 of the head 16 is received in a cylindrical bore 76 in the arm 36 and clamped in place by a bolt 78 with an axis D of the pick-up head 16 substantially vertical. The head also comprises a tool having an elongated support member 80 mounted in bearings carried by the housing 74 for movement in a direction lengthwise of the axis D and for rotational movement about the axis D. A tool body 82 is secured to a lower end portion of the support member 80 below the arm 36; the tool body 82 terminates at a lower end portion in a first pick-up surface 84 of an appropriate dimension and configuration. A lower end portion 86 of the support member 80 is housed in a cylindrical bore 88 of the tool body 82, the lower end portion 86 forming a substantially airtight seal with the cylindrical bore 88 and the tool body 82 being secured to the lower end portion 86 by suitable clamping means (not shown). A cylinder 90 is formed in the lower end portion 86 of the support member 80 within the body 82, the cylinder being coaxial with the axis D and opening downwardly into a chamber 92 formed by a lower portion of the cylindrical bore 88. A piston member 94 is mounted for sliding movement in the cylinder 92 and at a lower end portion provides a pick-up end portion 95 terminating with a tip 96 having a second pick-up surface 98 of the tool at the lowermost end portion thereof. The second pick-up surface 98 is of smaller cross-sectional area than the first pick-up surface 84. The pick-up end portion 95 of the piston member 94 is slidable in a passage 100 in the tool body 82 between an operative position in which the tip 96 projects through an opening (provided by the end of the passage 100) in the first pick-up surface 84 beyond the first pick-up surface 84 (in which position the piston member is shown in FIG. 2) and an inoperative position in which the tip 96 is retracted into the tool body 82 inwardly of the first pick-up surface 84. A first port 102 is provided in the tool body 82; air can be admitted through the first port 102 to the cylinder 90 above the piston member 94 to drive the piston member 94 downwardly to its operative position. The first port 102 can likewise be connected to vacuum to retract the piston member 94 to its inoperative position.

The illustrative component placement machine further comprises valve means (not shown) for controlling flow of air and connection of vacuum to the various ports of the illustrative machine, through appropriate pipes; in the case of ports e.g. the port 102, in the tool use of flexible piping may be necessary to accommodate movement of the tool. The illustrative machine also comprises means so constructed and arranged that when the piston member 94 is in its inoperative position suction may be applied to the first pick-up surface 84 whereby a component (not shown) engaged by the first pick-up surface 84 is retained in contact with the surface 84 when suction is applied and that when the piston member 94 is in its operative position suction may be applied through an opening 104 in the piston member 94 to the second pick-up surface 98 whereby a component engaged by the second pick-up surface 98 is retained in contact with the second pick-up surface 98 when suction is applied through the opening 104. To effect application of suction through the opening 104 the tool body 82 comprises a second port 106 opening to a passage (provided by the chamber 92 in the tool body 82) which is closer to the first pick-up surface 84 than is the cylinder 90. The opening 104 is the termination of a lengthwise passage 108 in the pick-up end portion 95 of the piston member 94 extending from the second pick-up surface 98 in the direction in which the piston member 94 is slidable; a transverse passage 110 in the piston member 94 communicates with the chamber 92 and the lengthwise passage 108, the chamber 92 thereby being in communication with the opening 104 whereby to apply suction through the opening 104.

The pick-up end portion 95 of the piston member 94 is slidingly received in the connecting passage 10 in the tool body 82 which terminates in the opening in the pick-up surface 84 through which the tip 96 projects, when the piston member 94 is in its operative position, the tool body 82 bounding the passage 100 providing a substantially airtight seal about the pick-up end portion 95 of the piston member 94. The tip 96 of the piston member 94 is of smaller cross-sectional area than the remainder of the pick-up end portion 95 which slides in the passage 100 terminating in the opening in the first pick-up surface 84 whereby when the piston member 94 is in its inoperative position the chamber 92 in the body 82 is in communication around the tip of the piston member 94 through the passage 100 with the opening in the first pick-up surface 84 whereby to apply suction to the first pick-up surface 84. The pick-up head 16 is so dimensioned that the transverse passage 110 in the piston member 94 remains in communication with the chamber 92 when the piston member 94 is in its inoperative position whereby suction is applied to the first pick-up surface 84 through the opening 104 in the piston member 94 as well as around the tip 96 thereof.

A piston portion 112 of the piston member 94 which is slidable in the cylinder 90 is of greater diameter than the pick-up end portion 95 of the piston member 94, providing a shoulder 114, facing downwardly, at the junction of the piston portion 112 and the pick-up end portion 95 whereby when the piston member 94 is in its operative position application of vacuum to the first port creates a vacuum in the cylinder 90 and application of the same vacuum to the second port draws air under atmospheric pressure through the opening 104 and passage 108 in the piston member 94 into the chamber 92, the air under atmospheric pressure thereby urging the piston member 94 towards its inoperative position. After the piston member 94 has reached its inoperative position continued application of vacuum to the second port 106 is effective to apply suction through the opening to the first pick-up surface 84.

As hereinbefore mentioned the support member 80 is mounted in a tubular support housing 74 for sliding movement lengthwise of the axis D of the pick-up head 16 relative to the housing 74. A spring 116 acting between a stop face 118 in the housing and a collar 120 on the support member 80 urges the support member 80 to a raised position determined by engagement of the tool body 82 with a stop face of the arm 36 in which the pick-up head 16 is mounted. When the carousel 14 is being rotated about its axis B the pick-up heads 16 occupy this raised position in which they are clear of other operating instrumentalities of the illustrative machine.

As well as being movable lengthwise of the axis D of the pick-up head 16 the support member 80 and the tool body 82 are mounted for rotation around the axis D as described below. An upper end portion of the elongated support member 80 projects upwardly beyond an uppermost part of the tubular support housing 74. The tool of the illustrative machine further comprises coupling means including a drive sleeve 122 slidingly received on this upper end portion of the support member 80 and a tubular member 124; a lower end portion of the drive sleeve 122 is received in a cylindrical upper end portion of the tubular member 124 to which the drive sleeve 122 is secured. An outwardly projecting collar 126 of the drive sleeve 122 engages an upper edge of the tubular member 124. The tubular member 124 comprises, at a lower end portion, an inwardly projecting flange 128. A clutch pad 130 is supported on an upwardly facing surface of the flange 128 and is urged towards a downwardly facing surface of a collar 132 of the support housing 74 by a spring 134. Clutch means of the illustrative machine thus comprises the flange 128, the clutch pad 130, the collar 132 and the spring 134. The clutch pad 130 comprises slightly raised, radial, portions on opposite sides thereof, the raised portions at opposite sides of the pad being disposed along orthogonal radii, thus to provide accommodation for any slight misalignment of the parts of the tool and to ensure adequate engagement of the pad and surfaces. The spring 134 acts between an upwardly facing surface of the collar 132 and a lower member of a bearing race 136 slidingly received on an outer upper end portion of the housing 74 and with an upper member of the race 136 housed in a recess in a lower face of the drive sleeve 122. Thus, in a normal condition of the pick-up head 16, the spring 134 bearing on the race 136 urges the drive sleeve 122 upwardly, relative to the housing 74, the drive sleeve 122 secured to the tubular member 124 thus urging the tubular member 124 upwardly and, through the flange 128, urging the clutch pad 130 firmly against the collar 132 of the support housing 74. Thus, in the normal condition of the pick-up head, the tubular member 124 is locked through the clutch pad 130 to the collar 132 of the housing so that the tool cannot rotate relative to the housing and thus is unable to rotate about the axis D. However, by a downward pressure, viz. along the axis D, on the drive sleeve 122, the clutch pad 130 may be released from the collar 132 thereby permitting rotation of the tool about the axis D. In order to effect such rotation, therefore, where it is necessary in the operation of the illustrative machine, orienting means is provided to engage the drive sleeve 122 and urge it downwardly to release the clutch pad 130 (permitting rotation of the drive sleeve 122 about the axis D) and to effect rotation of the drive sleeve 122 through a desired angle under the control of the computer control system. Rotation of the drive sleeve 122 is effective to rotate the support member 80 (and thus the tool body 82 secured thereto) about the axis D of the pick-up head 16 as described below.

As previously mentioned, the support member 80 is slidable lengthwise of the axis D relative to the drive sleeve 122. However, the support member 80 is engaged with the drive sleeve 122 for rotation about the axis D with the drive sleeve 122 as a unit: this engagement is effected by means of a roller 138 and guide member 140. The roller 138 is mounted for rotation on an axle 142 secured in an upper end portion of the support member 80, the axle 142 projecting through a slot 144 in the wall of the drive sleeve 122. The roller 138 is arranged to run on a vertical face of the guide member 140, the guide member 140 being secured to the drive sleeve 122; the vertical face of the guide member 140 is parallel with the axis D of the pick-up head 16. A second roller 146 is also mounted on the axle 142, outwardly of the roller 138, and engages a leaf spring 148 secured to the drive sleeve 122 and bearing on the roller 146 to urge the roller 138 firmly against the vertical face of the guide member 140. By adjustment of the position of the drive member 140 on the sleeve 122 during the initial setting up of the pick-up head 16 the angular orientation about the axis D of the support member 80 (and thus the tool body 82 secured thereto) relative to the drive sleeve 122 can be adjusted as desired. Thus, when the support member 80 is moved lengthwise of the axis D relative to the drive sleeve 122 engagement of the roller 138 with the vertical face of the guide member 140 assists in guiding the support member 80 along a path parallel with the axis D. During movement of the support member 80 and attached tool body 82 from the raised position in which the tool of the pick-up head is shown in FIG. 2 to a lower position and return movement to the raised position, rotation of the drive sleeve 122 is prevented by engagement of the clutch pad 130 between the flange 128 and collar 132 under pressure applied by the spring 134, thereby preventing rotation of the support member 80 about the axis D by means including the rollers 138, 146, guide member 140 and spring 148 discussed above.

A keyway 150 is formed in the wall of the cylinder 90 of the support member, the keyway extending parallel to the axis D of the pick-up head. A key 152 secured to the piston member 94 is engaged in the keyway, permitting sliding movement of the piston member 94 lengthwise of the axis D in the cylinder 90, relative to the tool body 82, but keying the piston member 94 to the support member 80 so that when the support member 80 is rotated about the axis D the piston member 94 is likewise rotated. Thus the orientation of both the tool body 82 and the piston member 94, about the axis D, relative to the drive sleeve 122, is fixed: rotation of the drive sleeve 122 through a known angle is therefore effective to likewise rotate both the tool body 82 and the piston member 94 through the same angle. This enables the angular orientation about the axis D of both the first pick-up surface 84 and the second pick-up surface 98 to be controlled by the control system of the illustrative machine. This is especially useful when handling components, for example self components, which require tools having a pick-up surface of a special configuration adapted to accommodate the component in question. By rotating the tool about the axis D the appropriate first or second pick-up surface 84, 98 can be oriented at the pre-orientation station 58 to register with the orientation of a component presented by the supply means 18 at the pick-up station 26. Thereafter the tool can be rotated about the axis D again, if necessary, to orient a component carried on one of the surfaces 84, 98 substantially in accordance with the orientation required at the placement station 50 of the illustrative machine. Orienting means (not shown) for effecting rotation of the tool about the axis D are disposed at the orientation stations 42, 48, 58.

The illustrative machine comprises a camera (not shown) arranged at the inspection station 46 to inspect a component carried by a pick-up head 16 at the inspection station 46; the operation of the illustrative machine is controlled by the control system according to an image of the component received from the camera. The control system operates to direct a preselected placement position for a component at the placement station 50 by correction of the movement of the X-Y table 12 in accordance with the image of that component received from the camera when that component was at the inspection station 46. Likewise the control system of the illustrative machine is arranged to cause rotation (as described above) of a tool of a head 16 at the fine orientation station 48 about the axis D whereby to adjust the orientation of a component carried by the tool on one of the pick-up surfaces 84, 98 according to an image of that component received from the camera when the component was at the inspection station 46. In this way preselected placement position and orientation of a component programmed into the control system of the illustrative machine can be corrected in accordance with the precise position occupied by a component on a pick-up head 16.

In order for a component to be picked up from the component supply means 18 at the pick-up station 26 it is necessary to operate the tool of a pick-up head 16 which has been moved to the pick-up station 26 by rotation of the carousel 14 to move the selected one of the pick-up surfaces 84, 98 of the tool into engagement with the component, from the raised position of the tool, to retain the component against the selected one of the pick-up surfaces 84, 98 by suction applied as described above and to remove the component from the component supply means 18 by retraction of the pick-up tool to the raised position. Likewise, at the placement station 50 it is necessary to move the pick-up tool of a pick-up head 16 which has been moved by rotation of the carousel to the placement station, carrying a component retained on an appropriate one of the pick-up surfaces 84, 98 by suction as described above towards a substrate at the placement station 50 and to release the component placed on the substrate at the placement station 50 from the pick-up surface 84, 98. In order to effect these movements from the raised position in which the tool is shown in FIG. 2 to a lowered position and to return the tool to the raised position movement of the support member 80 and the tool body 82 attached thereto lengthwise of the axis D is necessary. To effect this movement, therefore, drive means 154 (see FIG. 3) is mounted on the main frame 10 (through the column referred to above) at the pick-up station 26 and placement station 50. The drive means 154 are generally similar in construction and operation and, for convenience, only one of the drive means 154 is described in detail hereinafter. The drive means 154 comprises a bracket 156 secured to the column and supporting aligned bearings 158 in which a tubular drive shaft 160 is mounted for vertical sliding movement. The tubular drive shaft 160 is positioned to be coaxial with the axis D of a pick-up head 16 disposed in an operative position at the station at which the drive means 154 is disposed. A drive plunger 162 is mounted for vertical sliding movement in the tubular drive shaft 160 (see also FIG. 2). The drive plunger 162 comprises bearing members 164 slidingly received in a cylindrical interior of the drive shaft 160. Means (not shown) is provided for admitting air under pressure to a chamber 168 formed by the cylindrical interior of the drive shaft 160 above the upper bearing member 164. Admission of air under pressure to the chamber 168 tends to urge the drive plunger 162 downwardly relative to the drive shaft 160, to an extent permitted by engagement of the lower bearing member 164 with a stop 166 in the drive shaft: the plunger 162 will normally occupy this rest position.

Figure 3:
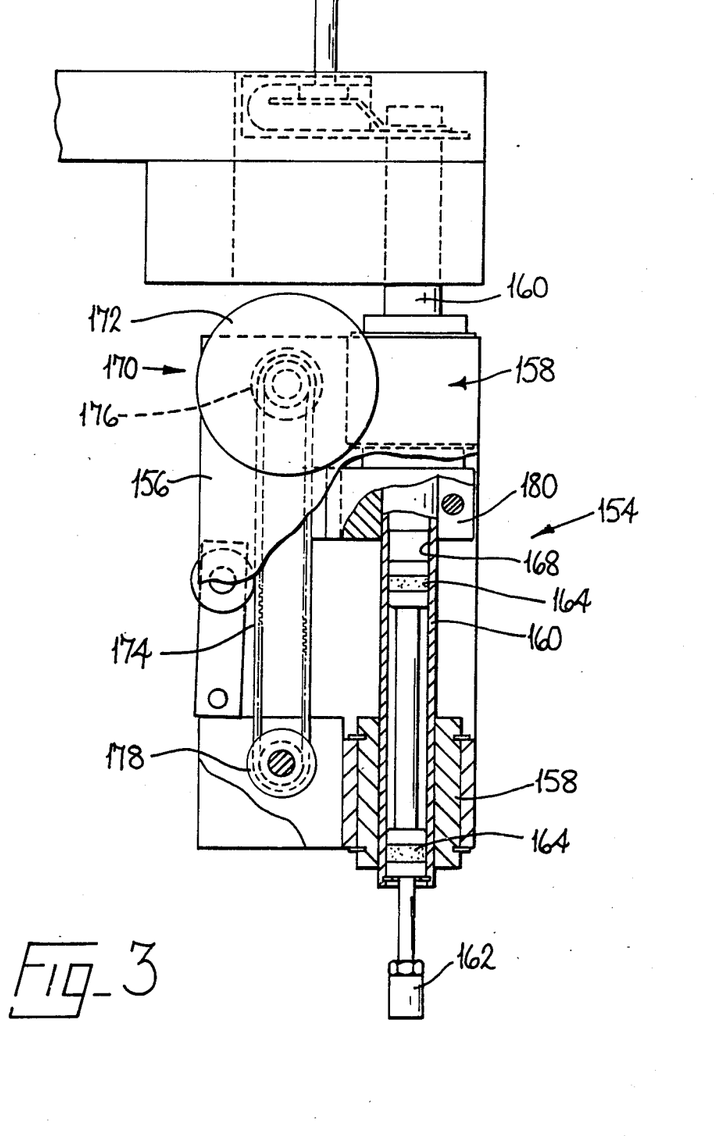
FIG. 3 is a side view, partly in section and with parts broken away showing drive means of the suction pick-up apparatus.

The drive means 154 further comprises motor means 170 arranged to drive the drive shaft 160 vertically to and from a raised position (in which the drive means is shown in FIG. 3). The motor means 170 of the illustrative machine comprises a servo motor 172, the angular rotation of which can be determined by a rotary encoder (not shown) in known manner. A continuous toothed belt 174 passes round a toothed pulley 176 on the output shaft of the servo motor 172 and a toothed idler pulley 178 mounted for rotation on the bracket 156 about an axis parallel with the output shaft of the servo motor 172 and disposed vertically beneath the output shaft of the servo motor 172, thereby providing two vertical runs of the toothed belt 174. A clamp 180 is clamped to the tubular drive shaft 160 and to one of the vertical runs of the toothed belt 174. Thus as the servo motor 172 rotates the vertical runs of the drive belt are caused to move in a vertical direction, the run of the toothed belt 174 to which the clamp 180 is attached causing corresponding movement of the drive shaft 160 vertically in the bearings 158. Using the encoder of the servo motor 172, the computer control system can control precisely the position to which the tubular drive shaft 160 is driven by the servo motor 172. Thus, when a pick-up head 16 is disposed at a station of the illustrative machine with its axis D aligned with the drive means, operation of the servo motor 172 can drive the shaft 160 downwardly so that the plunger 162 engages the upper end of the member 80 of the tool and drives it downwardly, as discussed in more detail below.

The illustrative machine comprises various interlocking safety mechanisms which prevent the drive means operating when the carousel 14 is rotating about its axis B and which prevent rotation of the carousel 14 if the drive shafts 160 are not in the rest position. In the illustrative machine no electrical connections are provided to the rotating carousel 14, the only service provided being pneumatic by the provision of compressed air or vacuum.

As described above, the illustrative machine provides drive means mounted at the pick-up station 26, the drive means being engageable with a portion of the tool of a pick-up head 16 at the pick-up station 26 to move the tool body 82 to carry one of the pick-up surfaces 84, 98 of the tool into engagement with a component presented at the pick-up station 26 by the supply means 18, the illustrative machine further comprising means provided by the spring 116 of raising the pick-up head 16 whereby to remove the component from the supply means 18. Similarly the illustrative machine comprises drive means mounted at the placement station 50 engageable with a portion of a tool of a pick-up head 16 at the placement station 50 to move the tool body 82 to place a component carried by the tool on a substrate at the placement station 50.

In order to achieve sufficient movement of the X-Y table 12 the uppermost surface of the table 12 and a substrate supported by the table is disposed below the lowermost level of the magazines 22 so that the X-Y table 12 and a substrate carried thereby may pass beneath the magazines during placement of components on the substrate. In order to restrict the amount of vertical travel of the pick-up heads 16 at any station, for example at the pick-up station 26 or the placement station 50, the cam track on the column is arranged to move the bracket 60 as the carousel 14 rotates about its axis B so that the bracket and thus the pick-up head 16 supported thereby occupy lower positions at the placement station 50 than at the pick-up station 26. The various operating means at intermediate stations are appropriately located to reduce the necessary vertical travel as much as possible at each location, thereby keeping the cycle time of the illustrative machine short.

Figure 4:
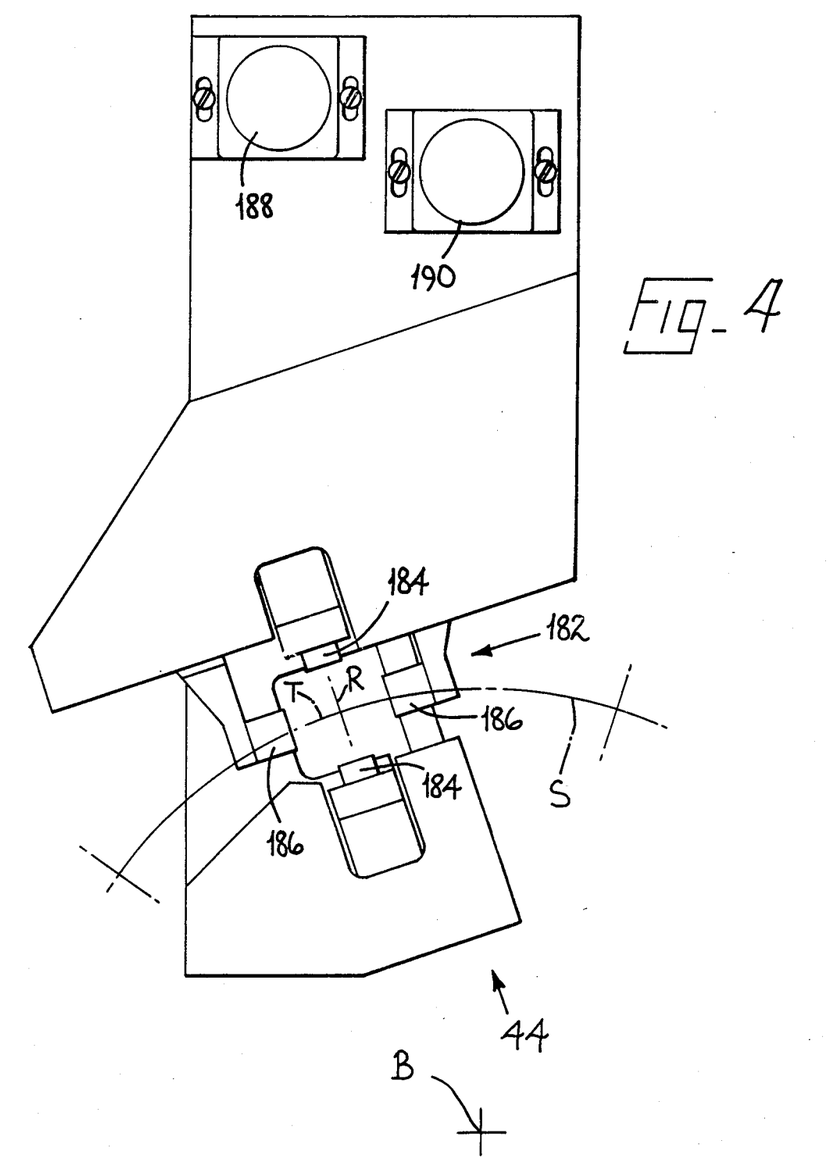
FIG. 4 is a diagrammatic plan view of a location system of the illustrative machine.

At the mechanical orientation station 44 a mechanical location jaw system 182 may be disposed, a pick-up head 16 at the mechanical orientation station 44 being arranged to introduce a component carried by the pick-up head 16 to the mechanical location system 182. For some components, mechanical orientation by means of jaws may be unnecessary and the computer control system of the illustrative machine can be programmed to disable the mechanical location system 182 if this be desired. The mechanical location jaw system 182 of the illustrative machine comprises two pairs of jaws 184, 186. The first pair of jaws 184 are mounted for movement on a path R radial to the axis of rotation of the carousel and the second pair of jaws 186 are movable on a path T tangential to the path S of rotation of the pick-up heads carried by the carousel 14 in the operative positions. Means are provided for moving the jaws 184, 186 along these paths R, T to engage a component carried by a pick-up head 16 to the mechanical orientation station 44 and thereby orient the component relative to the axis D of the head 16. For certain components it is necessary to position the components relative to the axis D in only one of two orthogonal directions (radial to the axis B of the carousel 14): the radial jaws 184 are therefore disposed with an operative portion lying in the same plane as the path of travel of a component carried by a pick-up head 16, whilst the tangential jaws 186 are disposed below the path of travel of a component, the radial jaws being of sufficient height to extend into register with the disposition of the tangential jaws 186. A drive means 154 is disposed at the mechanical orientation station 44 which is operated only when it is necessary to orient a component using both sets of jaws 184, 186 to lower the component carried by the pick-up head 16 into register with both the radial jaws 184 and the tangential jaws 186. Where it is necessary only to use the radial jaws 184 the component is carried between the jaws by rotation of the carousel and no lowering of the pick-up head is necessary, thereby saving time. The means for moving the jaws along their radial and tangential paths comprises servo motors 188, 190 provided with rotary encoders, which are controlled by the computer control system of the illustrative machine and suitable connecting linkages. During rotation of the carousel 14 to carry a component to the mechanical orientation station 44 the control system signals the motors to adjust the spacing between the jaws 184, 186 suitable for delivery of the next component to be oriented, the adjustment being sufficient to allow introduction of the component between the jaws whilst reducing the travel necessary to perform an orientating operation as much as can safely be permitted. Use of servo motors 188, 190 controlled in this way can also be desirable in limiting the closing motion of the jaws 184, 186 so that the jaws define a restricted area within which a component is located: the dimensions of this restricted area are conveniently selected to be slightly greater than the dimensions of the component to be oriented, avoiding the possibility of the component being gripped between the jaws and damaged (which may occur very easily where a component is fragile, for example a chip).

In the operation of the illustrative machine using the suction pick-up apparatus the pressure exerted by the tool on a component when it is being picked up from the component supply 18 at the pick-up station 26 and when it is being placed on a substrate at the placement station 50 can be controlled. The motion of the tool of the pick-up head 16 along its axis D is affected, in the downward direction, by the drive shaft 160 driven by the servo motor 172 and the upward, return motion to the rest position of the tool is affected by the spring 116, under the control, however, of the servo motor 172, the spring 116 maintaining the upper end portion of the support member 80 in engagement with the drive plunger 162 as the tool rises until it reaches its rest position. The distance through which the support member 80 is driven downwardly by the servo motor 172 is dependent upon whether or not the first pick-up surface 84 or the second pick-up surface 98 is to be used and on the height of the component to be picked up as well as, at the placement station, the height of the surface of the substrate on which the component is to be placed. In all cases, the servo motor 172 is controlled by the computer control system of the illustrative machine to drive the support member 80 downwardly sufficiently far that a little-over travel occurs, cushioned by air under pressure, the pressure of the air being controlled to determine the force applied by the pick-up surface 84, 98 on the component as the component is pressed against the magazine 22 (at the pick-up station 26) or a substrate (at the placement station 50). Where the piston member 94 is in the operative position the cushion effect is provided by air under a suitable pressure admitted through the first port 102 to the cylinder 90 above the piston member 94. As the surface area of the second pick-up surface 98 on the piston member 94 is less than the surface area of the pick-up surface 84 the tool provided by the piston member 94 handles smaller components than the tool provided by the body 82 and the pressure exerted on a component by the piston member 94 is therefore usually very small. When the piston member 94 is retracted and in its inoperative position the component will be engaged by the first pick-up surface: in this case the air cushion is provided by the air under pressure in the chamber 168 in the tubular drive shaft 160 of the drive means 154. The downward force exerted by air pressure in the chamber 168 is considerably greater than that exerted by air pressure in the cylinder 90 applied to the piston member 94 when the second pick-up surface 98 is in use.

When a component has been placed on a substrate at the placement station 50, air under pressure may be introduced through the second port 106, if desired, under the control of the control system to assist separation of the component from the pick-up surface 84, 98 by which it was engaged.

Although to operate the various parts of the illustrative machine servo motors and rotary encoders are used, other controllable drive means may be used e.g. stepping motors. However, servo motors are preferred in view of their speed of operation, precision and general convenience.

The illustrative machine is able to handle picking and placing of electrical or electronic components at high rates. The vacuum pick-up apparatus of the illustrative machine permits use of a plurality of tools having pick-up surfaces of different areas add/or configurations without the delay entailed in exchanging tools at a tool supply magazine as proposed in some heretofore known machines. A single head of the vacuum pick-up apparatus of the illustrative machine provides two tools, one of which has a pick-up surface of larger area than the other, an appropriate one of which can be positively selected under the control of the machine control system at the select station 56 before engagement of the tool with a component to be picked up. Furthermore, provision of two such pick-up heads 16 on each carrier 34 permits selection of any one of four tools of an appropriate size and configuration. The construction and arrangement of the illustrative machine is such that the cycle time is rapid and delays due to inertia of moving parts are militated against. In addition, because of the design of the tools, it is possible to place components at the placement station 50 in restricted spaces between adjacent components.

In the operation of the illustrative machine, if a particular pick-up head should fail to pick-up a component or a component, having been picked-up, be discovered to be faulty when inspected at the inspection station 46, the control system will cause a subsequent pick-up head to pick-up the appropriate component and reschedule the machine operation as necessary. When a substandard or incorrect component is detected at the inspection station 46, this will be carried through the placement station 50 without operation of the placement mechanism and dumped into a reject container at the dump station 54.

I claim:

1. A pick-up head for surface mount electronic components which are to be picked up by the use of suction comprising a pick-up tool including
    a first pick-up surface at the bottom thereof,
    a vertically extending cylindrical chamber, and
    a vertical bore extending vertically from said pick-up surface to the bottom of said chamber, a piston member including a cylindrical top portion and a cylindrical tip portion at the other end having a second pick-up surface at the bottom thereof, said vertical bore slideably receiving said cylindrical tip portion, cylindrical sleeve means secured within said chamber for slideably receiving said cylindrical top portion of said piston member, said piston member being displaceable between an elevated inoperative position and a lowered operative position, said chamber having a vertical length selected so that a portion thereof will be located above said elevated piston member, said sleeve means being selectively spaced from the bottom of said chamber to define an annular gap around said piston member, conduit means defined in said tip portion extending between said second pick-up surface and said gap, first and second conduits defined in said pick-up tool communicating, respectively with said chamber portion above said elevated piston element and with said gap so that piston element from said inoperative position to said operation position and so that vacuum can be applied to said second conduit to attach a component engaged by either of said first or second pick-up surfaces.

2. A pick-up head according to claim 1 further comprising means for displacing said tool incrementally downwardly from an elevated position downwardly to a pick-up location.

* * * * *